(12) United States Patent
Warner et al.

(10) Patent No.: US 12,550,305 B2
(45) Date of Patent: Feb. 10, 2026

(54) ELECTROMAGNETIC INTERFERENCE SHIELDING OF GAS DETECTOR

(71) Applicant: Carrier Corporation, Palm Beach Gardens, FL (US)

(72) Inventors: Tanner Warner, Chanhassen, MN (US); Slade Culp, Bradenton, FL (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 257 days.

(21) Appl. No.: 18/311,311

(22) Filed: May 3, 2023

(65) Prior Publication Data

US 2023/0363127 A1    Nov. 9, 2023

Related U.S. Application Data

(60) Provisional application No. 63/338,106, filed on May 4, 2022.

(51) Int. Cl.
*H05K 9/00* (2006.01)
*G01N 33/00* (2006.01)

(52) U.S. Cl.
CPC ....... *H05K 9/0088* (2013.01); *G01N 33/0027* (2013.01); *H05K 9/009* (2013.01); *H05K 9/0092* (2013.01)

(58) Field of Classification Search
CPC ....................................................... H05K 9/009
See application file for complete search history.

(56) References Cited

U.S. PATENT DOCUMENTS

2009/0084599 A1*  4/2009  Severance ................ C09D 5/32
                                                                361/818

\* cited by examiner

*Primary Examiner* — Hung V Ngo
(74) *Attorney, Agent, or Firm* — CANTOR COLBURN LLP

(57) ABSTRACT

Disclosed is an electromagnetic interference (EMI) cover for a gas detector including one or more electrical components. The EMI cover includes one or more cover layers, each cover layer including a plastic material layer and one or more layers of conductive or dielectric ink applied to the plastic material layer defining one or more conductive pathways. The one or more conductive pathways are positioned in a pattern to provide electromagnetic interference (EMI) shielding to the one or more electrical component.

14 Claims, 5 Drawing Sheets

ELECTROMAGNETIC INTERFERENCE SHIELDING OF GAS DETECTOR

CROSS-REFERENCE TO RELATED APPLICATIONS

This application claims the benefit of U.S. Provisional Application No. 63/338,106, filed May 4, 2022, the disclosure of which is incorporated by reference in its entirety.

BACKGROUND

Exemplary embodiments pertain to the art of gas detectors, and more specifically, to electromagnetic interference (EMI) shielding of gas detectors.

A product requirement for a new gas detector states that the detector must have light indicators while a second requirement is to have EMI protection for the circuitry of the gas detector to prevent disruption of the operation of the gas detector circuitry. Current gas detectors typically do not include such protection. Meeting each of these requirements may present issues in the sense that EMI shields require conductive material, which are typically not transparent, while light indicators require transparent material or openings of no material to allow light transmission.

BRIEF DESCRIPTION

In one embodiment, disclosed is an electromagnetic interference (EMI) cover for a gas detector including one or more electrical components. The EMI cover includes one or more cover layers, each cover layer including a plastic material layer and one or more layers of conductive or dielectric ink applied to the plastic material layer defining one or more conductive pathways. The one or more conductive pathways are positioned in a pattern to provide electromagnetic interference (EMI) shielding to the one or more electrical component.

Additionally or alternatively, in this or other embodiments the one or more conductive pathways are arranged in one of a grid pattern, a spoke and spiral pattern, or a spoke and wheel pattern.

Additionally or alternatively, in this or other embodiments the plastic material layer is transparent or translucent.

Additionally or alternatively, in this or other embodiments the one or more cover layers include a first cover layer and a second cover layer arranged in a stack.

Additionally or alternatively, in this or other embodiments a first plastic material layer of the first cover layer is positioned between a first electrically conductive ink layer of the first cover layer and a second electrically conductive ink layer of the second cover layer.

Additionally or alternatively, in this or other embodiments the first electrically conductive ink layer is arranged in a first pattern and the second electrically conductive ink layer is arranged in a second pattern different from the first pattern.

Additionally or alternatively, in this or other embodiments at least one light source is embedded in the stack or positioned on an exterior surface of the stack.

Additionally or alternatively, in this or other embodiments the light source is a light emitting diode.

Additionally or alternatively, in this or other embodiments the first electrically conductive ink layer is operably connected to the light source to power the light source, and the second electrically conductive ink layer is connected to electrical ground.

In another embodiment, a method of forming an electromagnetic interference (EMI) cover for a gas detector including one or more electrical component includes forming a plastic material layer, applying an electrically conductive ink layer to the plastic material layer forming one or more electrically conductive pathways, thereby defining one or more cover layers. The one or more cover layers are formed into a desired cover shape. The one or more conductive pathways are located in a pattern to provide electromagnetic interference (EMI) shielding to the one or more electrical component.

Additionally or alternatively, in this or other embodiments the electrically conductive ink is applied in one of a grid pattern, a spoke and spiral pattern, or a wheel and spoke pattern.

Additionally or alternatively, in this or other embodiments two or more cover layers are formed, and the two or more cover layers are arranged in a stack.

Additionally or alternatively, in this or other embodiments the stack is arranged such that a first plastic material layer of a first cover layer is located between a first electrically conductive ink layer of the first cover layer and a second electrically conductive ink layer of a second cover layer.

Additionally or alternatively, in this or other embodiments the first electrically conductive ink layer is arranged in a first pattern and the second electrically conductive ink layer is arranged in a second pattern different from the first pattern.

Additionally or alternatively, in this or other embodiments at least one light source is embedded or positioned in the stack or on an exterior surface of the stack.

Additionally or alternatively, in this or other embodiments the light source is a light emitting diode.

Additionally or alternatively, in this or other embodiments the first electrically conductive ink layer is operably connected to the light source to power the light source, and the second electrically conductive ink layer is connected to electrical ground.

Additionally or alternatively, in this or other embodiments the one or more cover layers are formed to the desired cover shape via an injection molding process.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
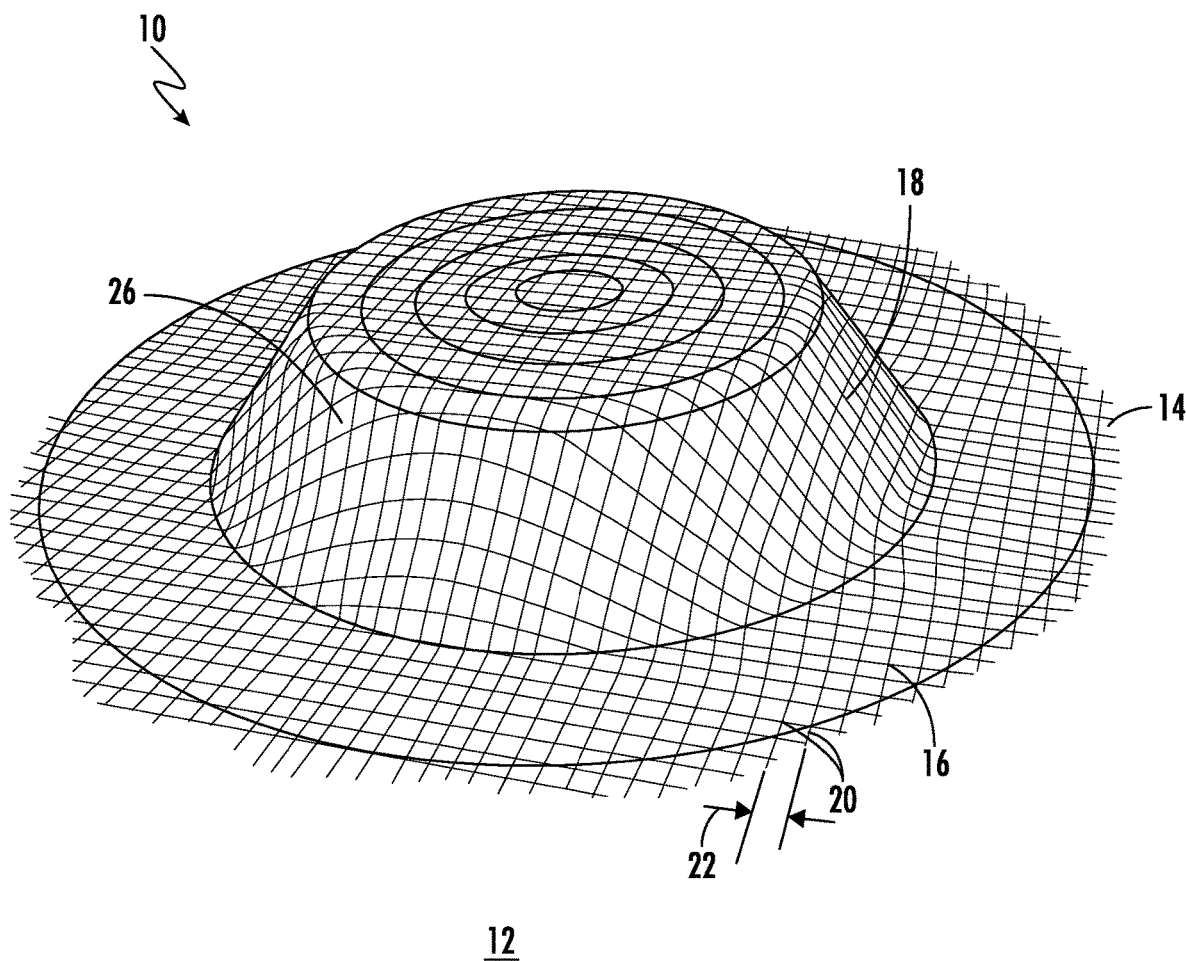
FIG. 1 is a perspective view of a cover with EMI shielding, in accordance with exemplary embodiments.

FIG. 1 is a perspective view of a cover 10 with electromagnetic interference (EMI) shielding. Although described herein that the cover 10 may be incorporated as a component of a gas detector 12, it should be appreciated that the application of the EMI shielding process described herein within any product is within the scope of the current disclosure. As shown in FIG. 1, the cover 10 may be positioned over the exterior of the gas detector 12 such that the components 12 behind the cover 10 (e.g., the gas detector circuitry) are protected from electromagnetic interference. As will be described below, the features of the cover 10 are provided to produce the EMI shielding for the components 12.

The cover 10 may be formed from one or more plastic material layers 14, which in some embodiments are formed from a transparent or translucent plastic material. One or more electrically conductive pathways 16 are embedded in the cover 10. The conductive pathways 16 are formed by, for example, electrically conductive ink 18 applied to one or more of the plastic material layers 14. The conductive pathways 16 may be formed into a pattern, for example, a grid pattern or the like. The pattern includes a plurality of pathway portions 20 having a selected spacing 22 between adjacent pathway portions 20 to provide a selected coverage of the conductive pathways 16 in the cover 10, thus providing a desired level of EMI shielding in the cover 10. In at least one embodiment, the spacing 22 between adjacent pathway portions 20 is configured to provide shielding of up to a 6 Ghz frequency with a maximum spacing 22 of five (5) millimeters. In other embodiments, other spacing 22 may be used depending on the desired shielding, with smaller spacing 22 utilized to provide greater maximum shielding frequency.

Figure 2:
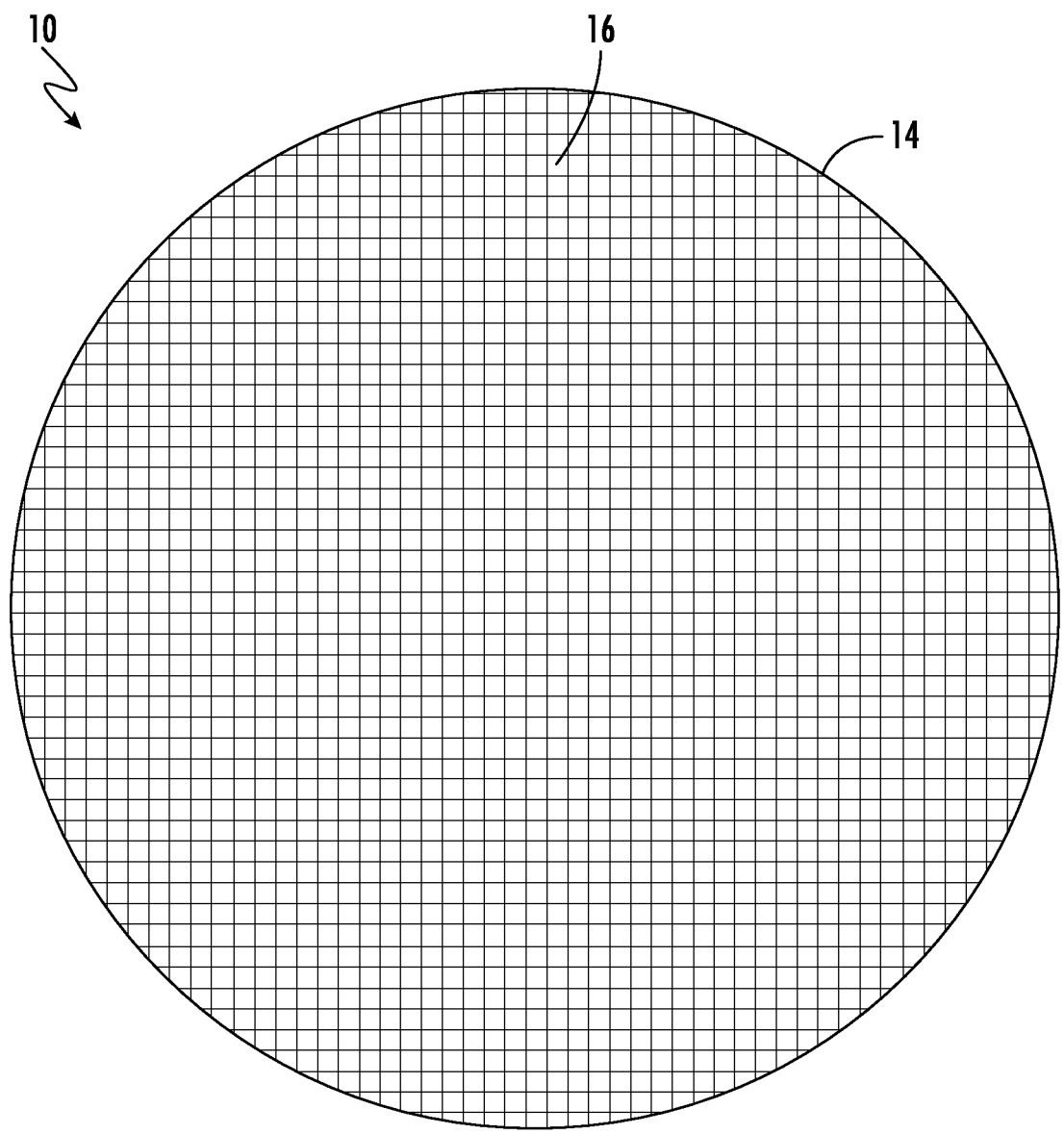
FIG. 2 is a plane view of an electrically conductive pathway arrangement in a cover, in accordance with exemplary embodiments.
Figure 3:
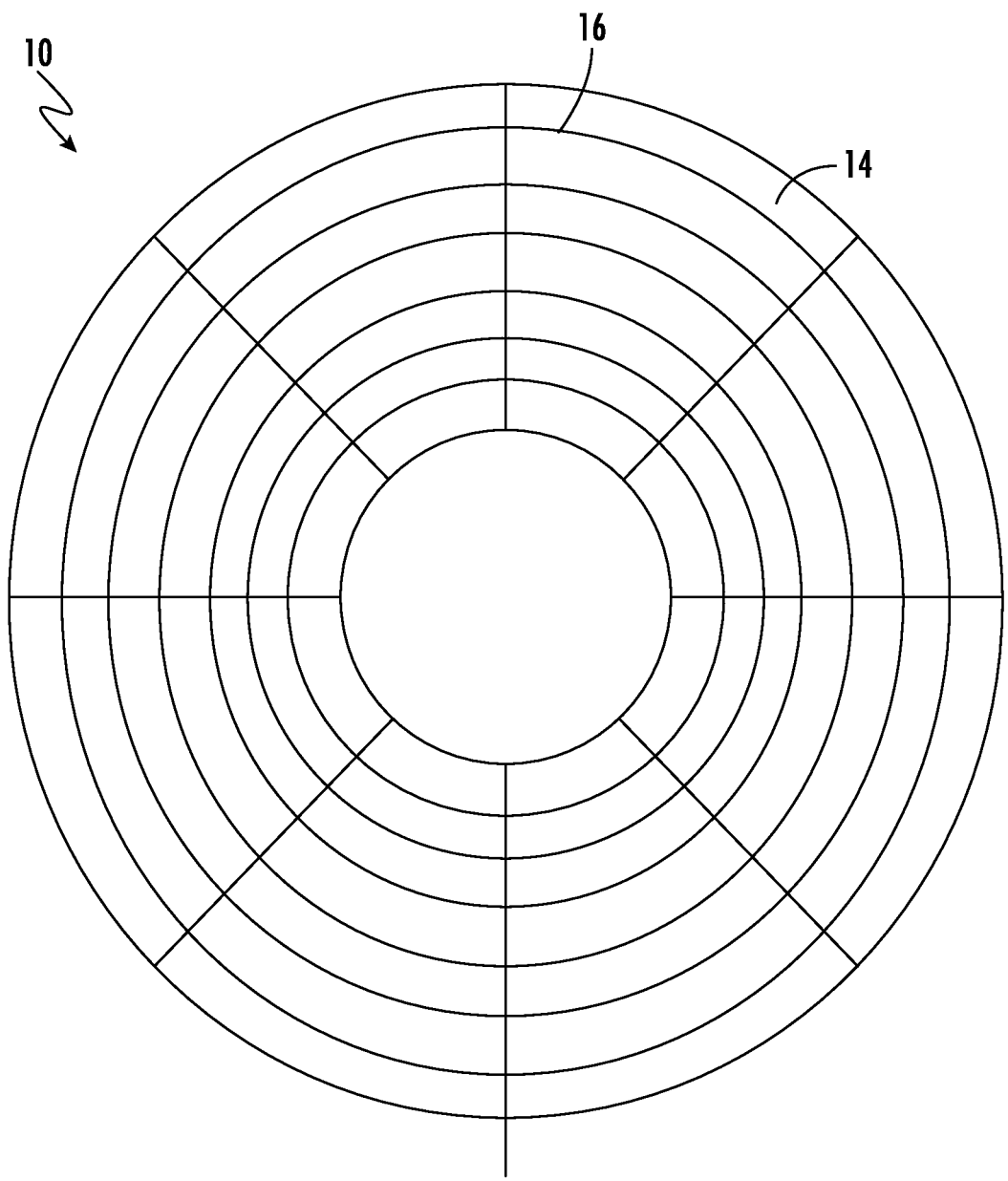
FIG. 3 is a plane view of another electrically conductive pathway arrangement in a cover, in accordance with exemplary embodiments.

Referring now to FIG. 2, in some embodiments the conductive pathways 16 are arranged in a grid pattern. In other embodiments, such as shown in FIG. 3, the conductive pathways 16 are arranged in a ring and spoke pattern, that is interconnected between the circular portions of the conductive pathways 16, or alternatively in another pattern such as a spoked spiral pattern. One skilled in the art will readily appreciate that the conductive pathways illustrated in FIGS. 2 and 3 are merely exemplary, and that other arrangements of conductive pathways 16 may be utilized to achieve a desired level of EMI shielding of the cover 10.

Figure 4:
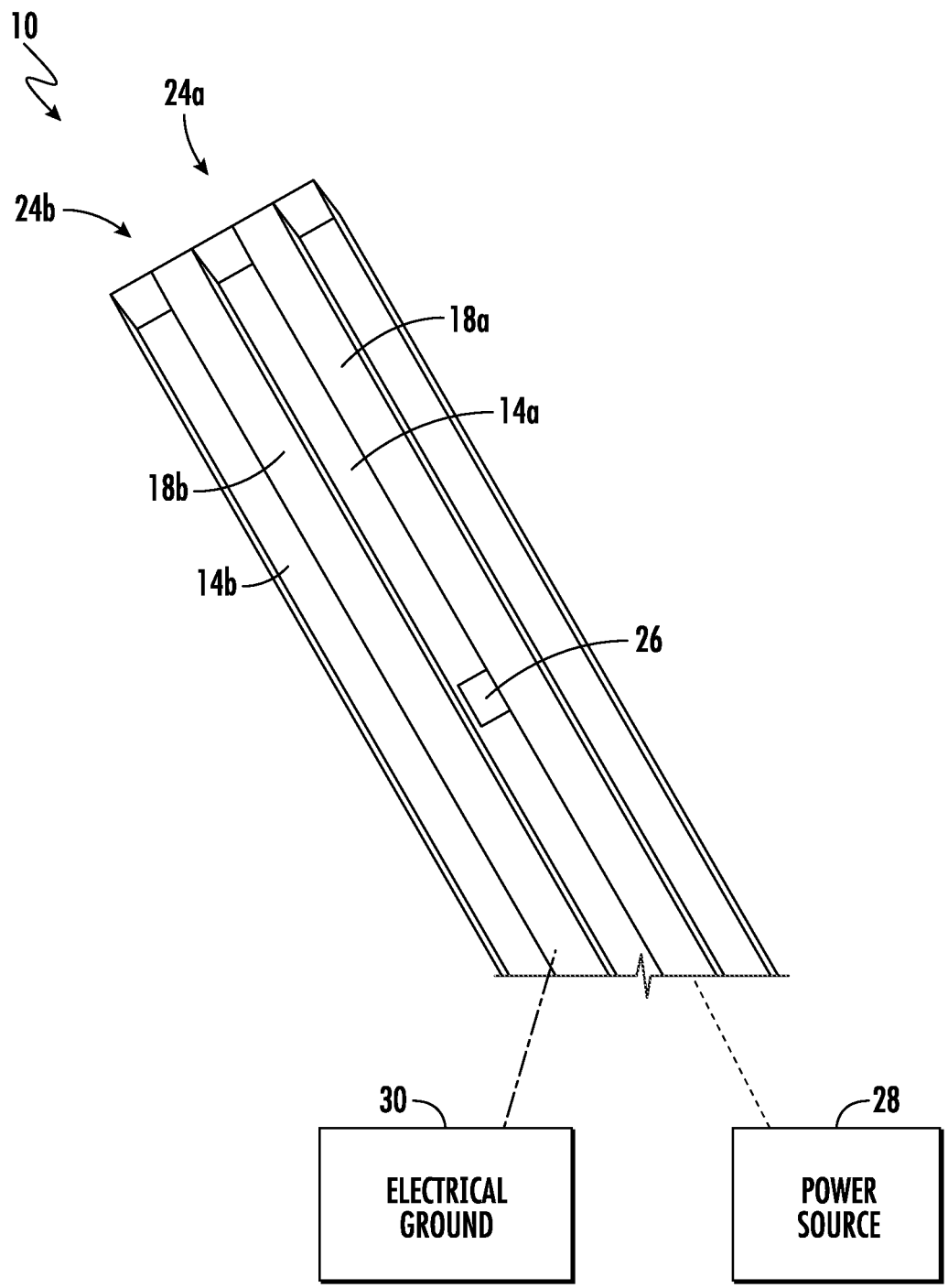
FIG. 4 is a cross-sectional view of a cover, in accordance with exemplary embodiments.

Referring now to FIG. 4, illustrated is a cross-sectional view of an embodiment of a cover 10. The cover 10 is a layered structure, having multiple cover layers 24 to form the cap 10. For example, the cover 10 may include two cover layers 24, each cover layer 24 including a plastic material layer 14 having electrically conductive ink 18 applied thereto to define one or more conductive pathways 16. The cover layers 24 may be stacked such that a first electrically conductive ink 18a of a first cover layer 24a does not contact a second electrically conductive ink 18b of an adjacent second cover layer 24b. One of the plastic material layers 14, such as a first plastic material layer 14a of the first cover layer 24a may be positioned between the first electrically conductive ink 18a and the second electrically conductive ink 18b to keep the first electrically conductive ink 18a separated from the second electrically conductive ink 18b. In some embodiments, the plastic material layer 14 is continuous covering the pathway portions 20 and the spacing, while in other embodiments the plastic material layer 14 is localized and present only in areas where the first electrically conductive ink 18a pathway portions 20a overlap the second electrically conductive ink 18b pathway portions 20b. In some embodiments, a light 26, for example, a light-emitting diode (LED), is incorporated or embedded into the cover 10. For example, the light 26 may be disposed between the first cover layer 24a and the second cover layer 24b. As shown, the light 26 may be connected to the first electrically conductive ink 18a, which is connected to a power source 28 defining a circuit for operation of the light 26. As shown, the second electrically conductive ink 18b may be connected to electrical ground 30. In the embodiment shown in FIG. 4, while the first electrically conductive ink 18a provides power to the light 26, the second electrically conductive ink 18b provides the desired EMI shielding. It should be appreciated that in certain instances the light 26 may be disposed on the exterior of the cover 10 (as opposed to being disposed between the cover layers 24a and 24b), and receive power from the first electrically conductive ink 18a. For example, the light 26 may be disposed on the external surface of the first electrically conductive ink 18a, instead of being disposed in the plastic layer between the first electrically conductive ink 18a and the second electrically conductive ink 18b.

Figure 5:
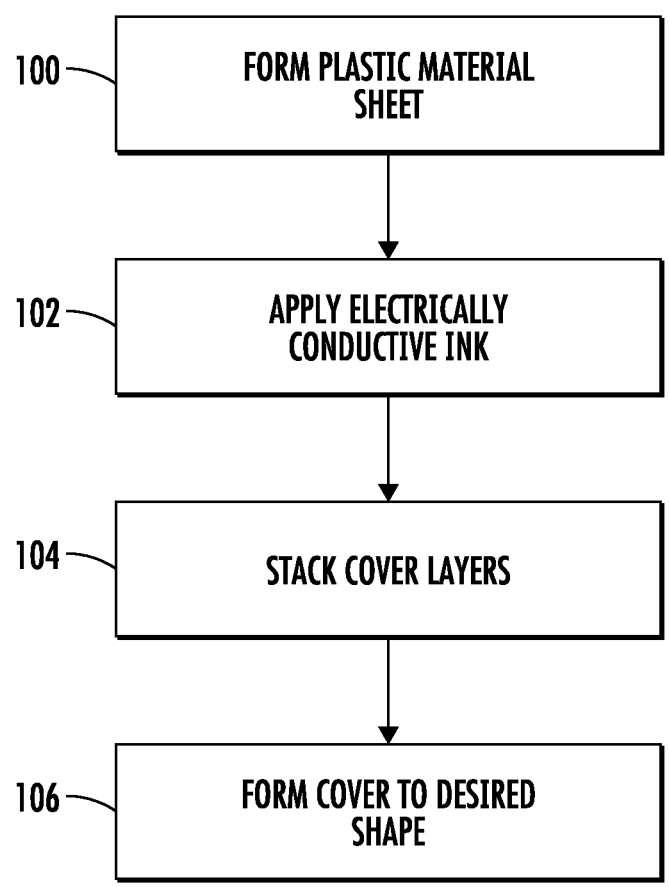
FIG. 5 is a flow diagram illustrating a method of forming a cover with EMI shielding, in accordance with exemplary embodiments.

In some embodiments, the cover layers 24 are formed in flat sheets, with the electrically conductive ink 18 applied to the flat plastic material sheet 14. Example methods of application of the conductive ink may include extrusion, screen printing, pad printing, gravure application, or the like. The cover layers 24 may then be formed to their desired shape to define the cover 10. An exemplary method of forming the cover 10 is illustrated in FIG. 5. In step 100, the plastic material sheet 14 is formed, and in step 102 the electrically conductive ink 18 is applied to the plastic material sheet 14 to define the electrically conductive pathways 16 and the cover layers 24. At step 104 the cover layers 24 are stacked, which may include embedding the light 26 between the cover layers 24. As described above, the light 26 may be disposed on the exterior of the cover 10 (as opposed to between the cover layers 24a and 24b), in certain instances. Once the cover layers 24 are stacked the cover layers 24 are fused together and formed to a selected shape to define the cover 10 at step 106 by, for example, injection molding or thermoforming to form the structural cover 10.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electromagnetic interference (EMI) cover for a gas detector comprising one or more electrical component, the EMI cover comprising:
   one or more cover layers, each cover layer including:
      a plastic material layer; and
         one or more layers of conductive or dielectric ink applied to the plastic material layer defining one or more conductive pathways;
   wherein the one or more conductive pathways are disposed in a pattern to provide electromagnetic interference (EMI) shielding to the one or more electrical component;
   wherein the one or more cover layers comprise a first cover layer and a second cover layer arranged in a stack; and
   wherein a first plastic material layer of the first cover layer is disposed between a first electrically conductive ink layer of the first cover layer and a second electrically conductive ink layer of the second cover layer.

2. The EMI cover of claim 1, wherein the one or more conductive pathways are arranged in one of a grid pattern, a spoke and spiral pattern, or a spoke and wheel pattern.

3. The EMI cover of claim 1 wherein the plastic material layer is transparent or translucent.

4. The EMI cover of claim 1, wherein the first electrically conductive ink layer is arranged in a first pattern and the second electrically conductive ink layer is arranged in a second pattern different from the first pattern.

5. The EMI cover of claim 1, further comprising at least one light source embedded in the stack or disposed on an exterior surface of the stack.

6. The EMI cover of claim 5, wherein the light source is a light emitting diode.

7. The EMI cover of claim 5, wherein:
   the first electrically conductive ink layer is operably connected to the light source to power the light source; and
   the second electrically conductive ink layer is connected to electrical ground.

8. A method of forming an electromagnetic interference (EMI) cover for a gas detector comprising one or more electrical component, the method comprising:
   forming a plastic material layer;
   applying an electrically conductive ink layer to the plastic material layer forming one or more electrically conductive pathways, thereby defining one or more cover layers; and
   forming the one or more cover layers into a desired cover shape;
   wherein the one or more conductive pathways are disposed in a pattern to provide electromagnetic interference (EMI) shielding to the one or more electrical component;
   wherein the one or more cover layers comprise a first cover layer and a second cover layer arranged in a stack; and
   wherein a first plastic material layer of the first cover layer is disposed between a first electrically conductive ink layer of the first cover layer and a second electrically conductive ink layer of the second cover layer.

9. The method of claim 8, further comprising applying the electrically conductive ink in one of a grid pattern, a spoke and spiral pattern, or a wheel and spoke pattern.

10. The method of claim 8, wherein the first electrically conductive ink layer is arranged in a first pattern and the second electrically conductive ink layer is arranged in a second pattern different from the first pattern.

11. The method of claim 8, further comprising embedding or disposing at least one light source in the stack or on an exterior surface of the stack.

12. The method of claim 11, wherein the light source is a light emitting diode.

13. The method of claim 11, further comprising:
   operably connecting the first electrically conductive ink layer to the light source to power the light source; and
   connecting the second electrically conductive ink layer to electrical ground.

14. The method of claim 8, wherein the one or more cover layers are formed to the desired cover shape via an injection molding process.

* * * * *